US006486745B1

(12) United States Patent
Manlove et al.

(10) Patent No.: US 6,486,745 B1
(45) Date of Patent: Nov. 26, 2002

(54) ADJUSTABLE VOLTAGE CONTROLLED OSCILLATOR

(75) Inventors: Gregory J. Manlove, Kokomo, IN (US); Lawrence D. Hazelton, Goodrich, MI (US); Mark B. Kearney, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 58 days.

(21) Appl. No.: 09/678,564

(22) Filed: Oct. 3, 2000

(51) Int. Cl.[7] .............................. H03K 4/06; H03L 7/06
(52) U.S. Cl. ...................... 331/143; 331/111; 331/175; 331/185; 331/186
(58) Field of Search ................................ 331/143, 182, 331/183, 185, 186, 111, 175; 327/132

(56) References Cited

U.S. PATENT DOCUMENTS 5,394,020 A * 2/1995 Nienaber ..................... 327/140
5,811,999 A * 9/1998 Hall et al. ................... 327/156

* cited by examiner

Primary Examiner—Arnold Kinkead
(74) Attorney, Agent, or Firm—Jimmy L. Funke

(57) ABSTRACT

An adjustable voltage controlled oscillator has an input for receiving a voltage signal and an integrator coupled to the input for generating a ramp signal. The circuit also includes an adjustable current supply coupled to an output of the integrator for supplying an adjustable amount of current. A comparator compares the ramp signal with a predetermined voltage. The circuit further includes an output for generating a frequency output as a function of the comparison, wherein the circuit is calibratible by adjusting current generated by the adjustable current supply.

21 Claims, 4 Drawing Sheets

ADJUSTABLE VOLTAGE CONTROLLED OSCILLATOR

TECHNICAL FIELD

The present invention generally relates to a voltage controlled oscillator circuit and, more particularly, to an adjustable voltage controlled oscillator circuit, such as is employed in a mass air flow meter, for converting a voltage input to a frequency output.

BACKGROUND OF THE INVENTION

Referring to FIG. 1, an air flow meter 10 is shown positioned at the output of an air cleaner 12 and at the intake side of a throttle 14 for measuring the amount of air passing into an internal combustion engine 16, such as for use in an automotive vehicle. The air flow meter generates a voltage signal proportional to the mass air flow. The internal combustion engine 16 is generally controlled by an engine control unit (ECU) 18. The air flow meter 10 includes a voltage controlled oscillator (VCO) circuit 20 for converting the voltage generated internally by the air flow meter 12 to a frequency signal f for processing by the ECU 18. Accordingly, the air flow meter 10, with VCO circuit 20, allows for measurement of the amount of air passing into the internal combustion engine 16 to allow the ECU 18 to control the amount of fuel being injected so as to regulate the air-to-fuel ratio in the combustion chamber.

A conventional voltage controlled oscillator circuit 20 for use in the air flow meter 10 is illustrated in FIG. 2. The VCO circuit 20 includes an operational amplifier 28 having a negative terminal (−) coupled to a voltage input $V_B$ via a series of multiple external resistors, identified herein by resistor 24. The positive terminal (+) of the operational amplifier 28 is coupled to reference voltage input $V_{REF}$. A capacitor 30 is coupled between the output 26 and the negative terminal of amplifier 28. The operational amplifier 28, resistor 24, and capacitor 30 form an integrator that generates a ramp voltage, identified as RAMP. In addition, the conventional VCO circuit 20 includes a comparator 32 that compares the output 26 of amplifier 28 to +1 volt, and provides an output to an inverter 34. The inverter output is connected to the enable input of a oneshot monostable multivibrator circuit 36 which, in turn, generates a frequency output signal f at output 44. The oneshot circuit 36 is coupled to capacitor 40 and resistor 38, both of which are coupled to ground. The negative terminal of the amplifier 28 is further coupled to a current source 46 via switch 42.

The current through the resistor 24 is referred to herein as $I_{IN}$. When the ramp voltage is below one volt, the comparator output is low. When the ramp voltage is above one volt, the comparator output is high. The comparator output is applied through the inverter 34 to the oneshot circuit 30. The oneshot circuit 36 generates a positive pulse when the input thereto asserts a positive signal. When the output frequency signal at output 44 is high, the current $I_S$ generated by current source 46 is applied to the negative terminal of the amplifier 28, thereby causing the output 26 of the amplifier 28 to ramp with a positive slope. The negative slope of ramp signal increases with increased input voltage $V_B$ to change the frequency output.

One example of the ramp voltage (RAMP) at amplifier output 26 and output frequency signal 44 generated by the conventional VCO circuit 20 is illustrated in FIG. 3. The ramp voltage decreases in amplitude on negative slope 52 until output signal 44 is pulsed high. This occurs when the ramp voltage crosses below one volt at which time the current source $I_S$ is applied to the negative terminal of the amplifier 28, and ramp voltage begins to ramp up on positive slope 50. The positive slope 50 of the ramp voltage is maintained until the output signal 44 asserts low. At that point, the ramp voltage slopes negative again and one period T of oscillation is complete.

The oscillation period (T=1/f) generally is inversely proportional to the input current $I_{IN}$, and is proportional to the capacitor 40 in the oneshot circuit 36. The VCO circuit 20 is generally stable, with two elements primarily factoring into the frequency equation: the external input resistor 24; and the external oneshot capacitor 40. However, the conventional VCO circuit 20 suffers from a number of drawbacks that limit overall accuracy and linearity. First, the operational amplifier 28 has a finite bandwidth and slew rate. There exists a rapid change in the ramp voltage when the oneshot pulse is asserted and de-asserted. This generally causes errors in the ramp voltage and is a source of overshoot 48 and rounding errors. These errors generally result in non-linearity in the voltage-to-frequency relationship. Secondly, the rapid changes in the amplifier output generally require significant current from a regulated voltage supply. This increases the complexity of the regulator design and increases the regulator output noise. Third, the oscillator frequency typically can only be modified by adjusting the value of the external resistor 24 or the value of reference voltage $V_{REF}$ which is typically generated by an external voltage source and a resistor divider network. The standard approach for adjusting an external resistor has been to perform laser trimming which is generally expensive and is implemented when the device is not under flow. This requires an independent measurement and trim process in the manufacturing flow which are costly and limit accuracy of the overall response. Finally, the VCO circuit output is not at a fixed duty cycle. This requires the response time of the engine control unit monitoring the frequency to be as fast as the narrowest pulse possible out of the VCO circuit, rather than half of the minimum. This can be a problem, particularly at high input voltages $V_B$.

Accordingly, it is therefore desirable to provide for a voltage controlled oscillator circuit with reduced error signals. It is also desirable to provide for a voltage controlled oscillator circuit that can be easily adjusted without requiring laser trimming. It is further desired to provide for a voltage controlled oscillator circuit that reduces the amount of current supply required from the regulated supply. Yet, it is further desirable to provide for a voltage controlled oscillator circuit having a fifty percent duty cycle.

SUMMARY OF THE INVENTION

The present invention provides for an adjustable voltage controlled oscillator circuit for converting a voltage to a frequency. The voltage controlled oscillator comprises an input for receiving a voltage input signal, an integrator coupled to the input for receiving the voltage input signal and generating a ramp signal. According to one aspect of the present invention, the circuit also includes an adjustable current supply coupled to the integrator for supplying an adjustable amount of current. A comparator compares the ramp signal with a predetermined voltage. The circuit further includes an output for generating a frequency output signal as a function of the comparison, wherein the oscillator circuit is calibratible by adjusting current generated by the adjustable current supply. According to another aspect of the present invention, a first current source supplies current to the input of the integrator, and a second current source supplies current to the output of the integrator.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENT

Figure 1:
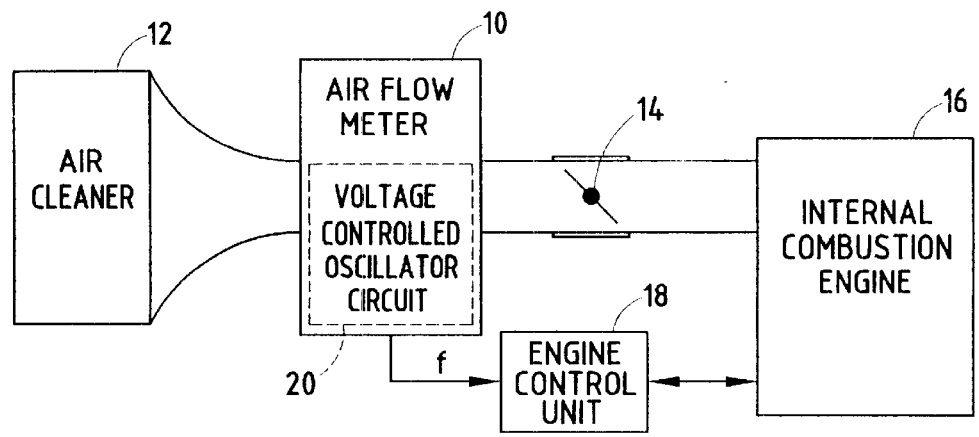
FIG. 1 is a block diagram illustrating the application of an air flow meter containing a voltage controlled oscillator circuit for use with an internal combustion engine of an automotive vehicle.
Figure 2:
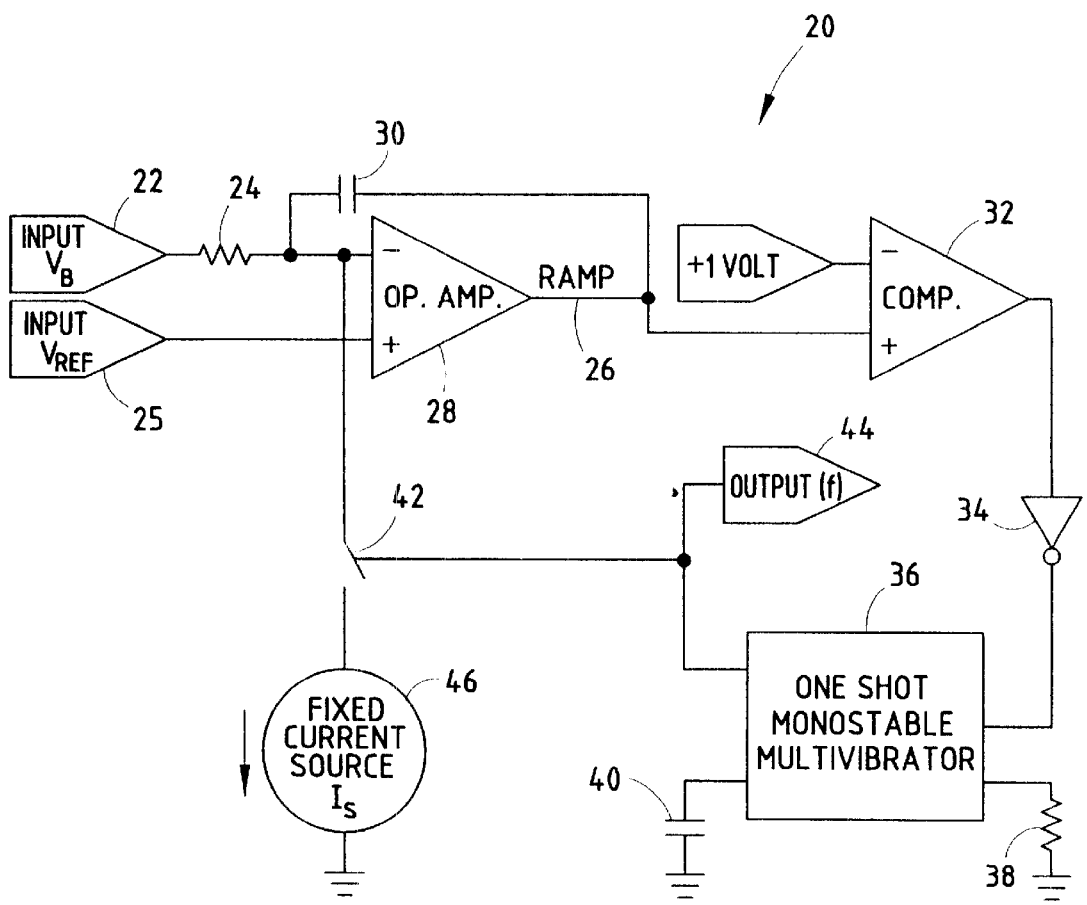
FIG. 2 is a circuit diagram illustrating a conventional voltage controlled oscillator circuit.
Figure 3:
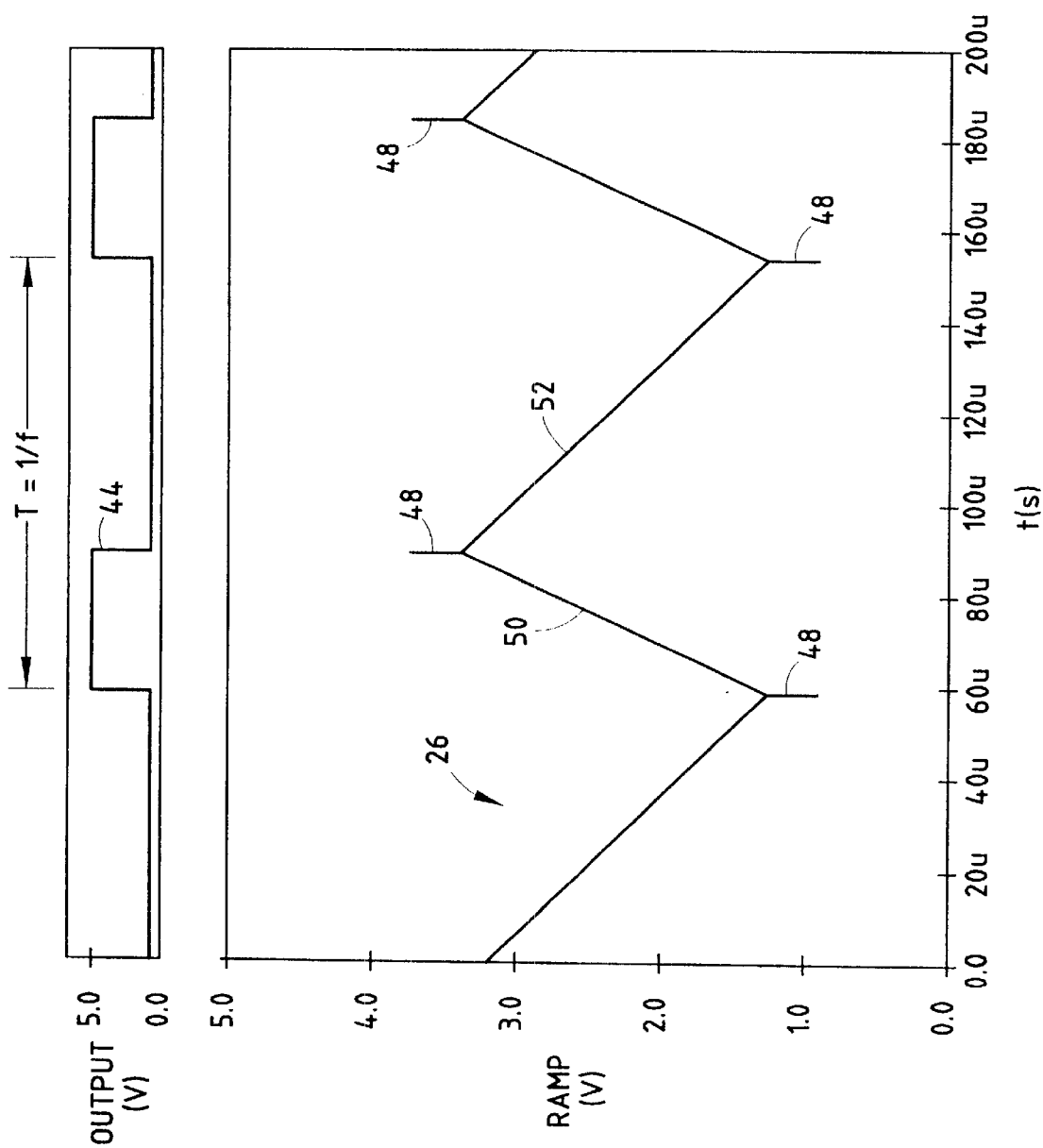
FIG. 3 is a graph illustrating signals generated with the circuit shown in FIG. 2, according to one example.
Figure 4:
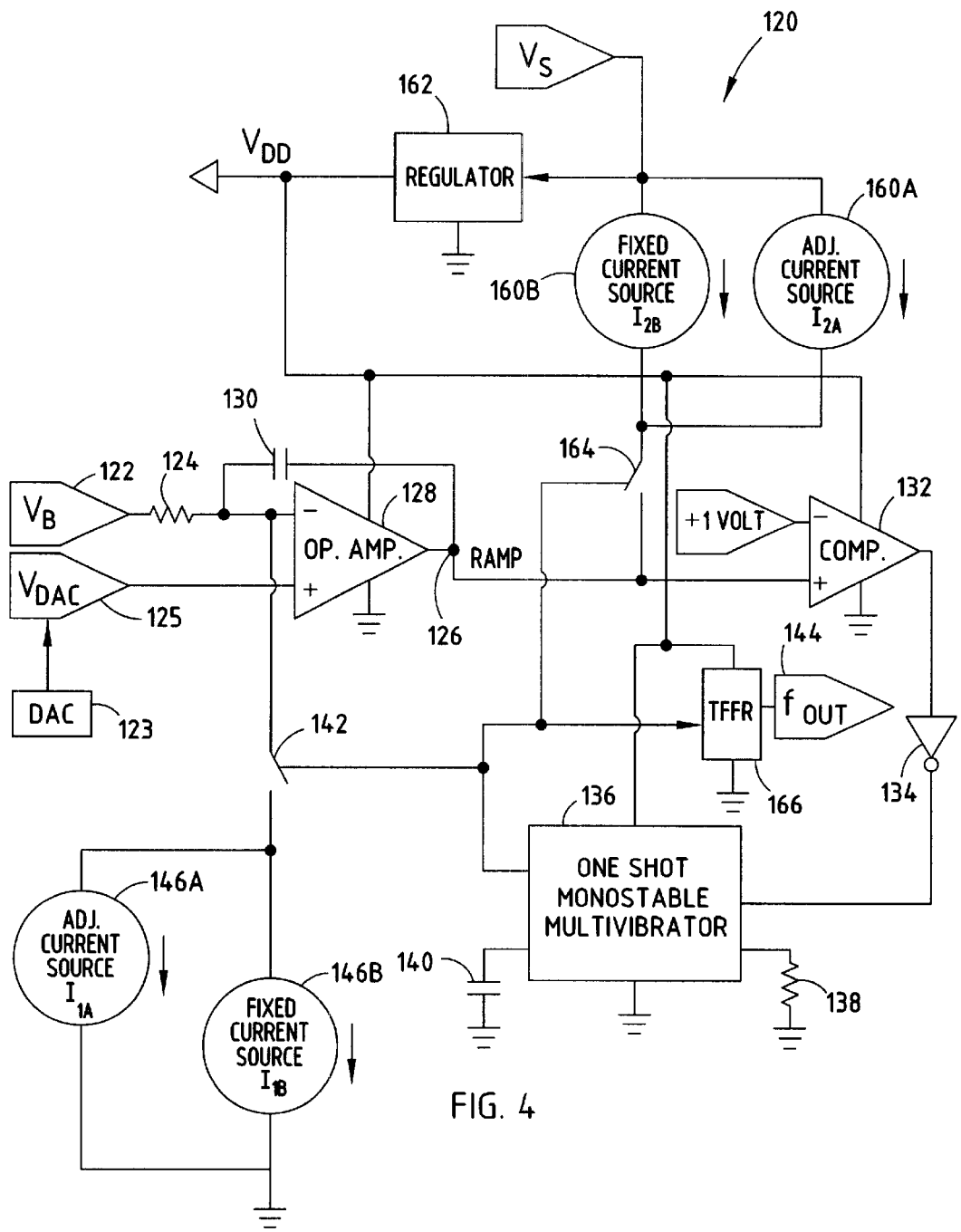
FIG. 4 is a circuit diagram illustrating an adjustable voltage controlled oscillator circuit according to the present invention.

Turning to FIG. 4, a linear adjustable voltage controlled oscillator circuit 120 is shown for converting an input voltage $V_B$ to an output frequency signal $f_{OUT}$. The adjustable voltage controlled oscillator circuit 120 may be employed for use in an air flow meter, such as is illustrated in FIG. 1, for measuring mass air flow into an internal combustion engine of an automotive vehicle. While the circuit 120 is described herein for use in connection with an air flow meter, it should be appreciated that the adjustable voltage controlled oscillator circuit 120 of the present invention may be employed in other applications for converting an input voltage to an output frequency.

The adjustable voltage controlled oscillator circuit 120 includes an input 122 for receiving input voltage $V_B$. Input 122 is coupled to the negative terminal (−) of an operational amplifier 128 via one or more resistors, referred to herein as resistor 124. The positive terminal (+) of the operational amplifier 128 is connected to reference input 125 for receiving a voltage $V_{DAC}$ from a digital-to-analog converter (DAC) 123. Voltage $V_{DAC}$ is adjustable via the DAC 123. Connected between the negative terminal and the output of the operational amplifier 128 is a capacitor 130. The operational amplifier 128, capacitor 130, and resistor 124 form an integrator for integrating the input voltage $V_B$ to generate a ramp voltage, identified as RAMP, at amplifier output 126.

The amplifier output 126 is coupled to the positive terminal (+) of a comparator 132. The negative terminal (−) of comparator 132 is coupled to +1 volt reference. Accordingly, comparator 132 compares the ramp voltage with the +1 volt reference and generates a high or low output based on the comparison. The output of comparator 132 is connected to an inverter 134 which, in turn, is connected to the enable input of a oneshot monostable multivibrator circuit 136. The oneshot monostable multivibrator circuit 136 includes a resistor 138 and a capacitor 140, both coupled to ground.

The output of the oneshot monostable multivibrator circuit 136 is coupled to a toggle flip-flop with reset (TFFR) 166. The TFFR 166 performs a divide-by-two function on the frequency signal to generate a fifty percent duty cycle which minimizes the speed requirements of the processing devices. In addition, the output of oneshot circuit 136 is coupled to switches 142 and 164 for controlling the opening and closing the switches 142 and 164. Switches 142 and 164 are controlled so as to open and close in sync with each other. The output of TFFR 166 in turn is coupled to an output 144 for providing the frequency output signal $f_{OUT}$.

The negative terminal of operational amplifier 128 is further coupled to current sources 146A and 146B when switch 142 is closed. Current source 146B is a fixed current source for generating current $I_{IB}$. Current source 146A is an adjustable current source $I_{IA}$ for providing an adjustable amount of current. Together, current sources 146A and 146B together provide a current drain from the negative terminal of the operational amplifier 138 when switch 142 is closed. The current $I_{IA}+I_{IB}$ applied to the negative terminal of operational amplifier 128 causes the ramp voltage to ramp positive.

The voltage controlled oscillator circuit 120 further includes a pair of current sources 160A and 160B coupled to the output 126 of operational amplifier 128 when switch 164 is closed. Current source 160B is a fixed current source for generating a fixed current $I_{2B}$. Current source 160A is an adjustable current source for generating an adjustable amount of current $I_{2A}$. Current sources 160A and 160B together provide a supply of current to the output of operational amplifier 128 when switch 164 is closed. The combined amount of current generated by current sources 160A and 160B is preferably substantially equal to the combined amount of current generated by current sources 146A and 146B at the input of operational amplifier 128. Switches 142 and 164 are controlled to close and open at the same time so that the current sources 160A and 160B are applied to the output of the operational amplifier 128 at the same time that current sources 146A and 146B are applied to the input of the operational amplifier 128, such that the operational amplifier 128 is not required to draw large amounts of current that may otherwise inject errors into the signal.

The total current $I_{2A}+I_{2B}$ applied to the output 126 of operational amplifier 128 is equal to the current $I_{IA}+I_{IB}$ applied to the input of operational amplifier 128. This minimizes the amplifier requirements for speed and slew rate because the operational amplifier 128 need only respond to the mismatch between the input and output currents, instead of the total current. Without current sources 160A and 160B, the operational amplifier 128 would have to supply all of the current $I_{IA}+I_{IB}$ generated by current sources 146A and 146B. The finite slew rate and finite bandwidth of the amplifier would thereby limit the response of the system and cause errors which, in turn, would cause distortion in the oscillator.

It should be appreciated that current sources 160A and 160B are supplied directly from a non-regulated voltage supply $V_S$, instead of being supplied from a regulated voltage $V_{DD}$. Likewise, current sources 146A and 146B are preferably supplied from the voltage supply $V_S$. A regulator 162 is shown coupled to the supply voltage $V_S$ and generates the regulated voltage signal $V_{DD}$ for supplying voltage to power the semiconductor devices such as the operational amplifier 128, the comparator 132, the TFFR 166, and the oneshot circuit 136. Accordingly, the current draw through current sources 160A, 160B, 146A, 146B, does not adversely affect the regulated voltage signal $V_{DD}$ supplied to the semiconductor devices.

Figure 5:
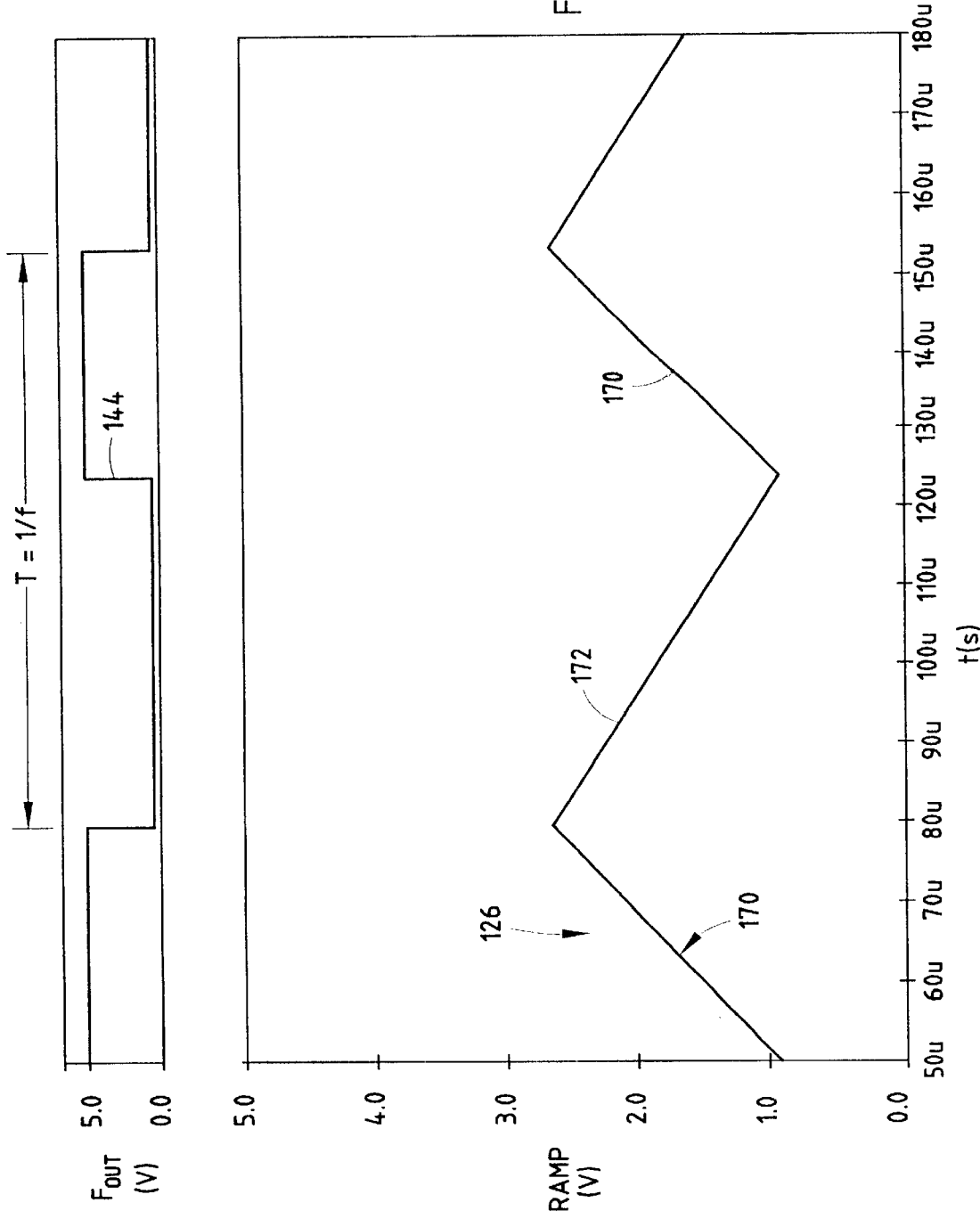
FIG. 5 is a graph illustrating signals generated with the circuit of FIG. 4, according to one example.

The operation of the adjustable voltage controlled oscillator circuit 120 will now be described with reference to FIGS. 4 and 5. The input voltage $V_B$, which may be a voltage proportional to the measured mass air flow into an internal combustion engine, is applied to input resistor 124. The input voltage $V_{DAC}$ may be modified electronically to change the offset of the oscillator response to the input voltage $V_B$ by way of digital-to-analog converter 123. The operational amplifier 128, in combination with the resistor 124 and capacitor 130, operates as an integrator to generate the ramp voltage at amplifier output 126.

The ramp voltage signal is applied to the positive terminal of comparator 132, and is compared with the one-volt reference. When the ramp voltage is below one volt, the comparator output is set low. When the ramp voltage is above one volt, the comparator output is set high. The comparator output is applied through inverter 134 to the oneshot monostable multivibrator circuit 136. The oneshot circuit 136 generates a positive pulse when the input thereto asserts positive. According to one example, the pulse may be nominally thirty microseconds.

The output of the oneshot circuit 136 turns on switches 142 and 164 which causes current $I_{1A}+I_{1B}$ to be applied to the negative terminal of operational amplifier 128, and also causes current $I_{2A}+I_{2B}$ to be applied to the amplifier output 126 at the same time. When the oneshot circuit 136 output is high, the combined current applied to the input and output of operational amplifier 128 causes the ramp voltage at the amplifier output 126 to slope positive 170 as shown in FIG. 5. The slope of ramp voltage signal increases as a function of the current $I_{1A}+I_{1B}$ and capacitance of capacitor 130. Due to the adjustability of adjustable current source 146A, it is possible to adjust the slope of the ramp voltage. As the rate of change (i.e., slope) in the ramp voltage changes, the frequency of the voltage controlled oscillator circuit 120 is adjusted. This allows the slope of the voltage to frequency transfer function of the voltage controlled oscillator circuit 120 to change with respect to the input voltage $V_B$ without modifying the external resistor 124.

The ramp voltage slopes negative 172 until the oneshot circuit 136 output is pulsed high. This occurs when the ramp voltage at amplifier output 126 crosses below one volt. The current sources 146A and 146B are applied to the negative terminal of the operational amplifier 128, and the ramp voltage at amplifier output 126 begins to ramp up. The positive slope 170 of the ramp voltage is maintained until the output of the oneshot circuit 136 asserts low. At that point, the ramp voltage slopes negative 172 again and one period T of oscillation is complete. The frequency (f) of the voltage controlled oscillator circuit 120 is proportional to various controllable parameters which can be represented as follows:

$$f \alpha [(V_B - V_{DAC})/(R_{IN} * C_{SHOT})] * A_I$$

where $R_{IN}$ is the resistance of resistor 124, $C_{SHOT}$ is the capacitance of capacitor 140 of the oneshot circuit 136, and $A_I$ is a current gain term that accounts for the adjustability of the adjustable current source 146A. Thus, the frequency of the voltage controlled oscillator circuit 120 is proportional to the input voltage $V_B$ and inversely proportional to the capacitance $C_{SHOT}$ of the oneshot capacitor 140. The addition of the digital-to-analog converter 123 allows for offset adjustments to the output frequency as a function of input voltage $V_B$. The addition of the adjustable current source 146A allows for slope adjustments to the output frequency as a function of input voltage $V_B$. The use of current sources 160A and 160B applied to the output 126 of operational amplifier 128 allows for reduced current draw from the operational amplifier 128. The use of an adjustable current source 160A allows the current applied to the output 126 of operational amplifier 128 to match the adjustable current applied to the input of the operational amplifier 128.

The adjustable voltage controlled oscillator circuit 120 of the present invention is extremely accurate and linear over a wide input voltage range and is particularly useful for use in a mass air flow meter application. The circuit 120 achieves significant performance advantages over prior VCO circuits, and is electronically adjustable without modifying the value of external elements.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

What is claimed is:

1. An adjustable voltage controlled oscillator circuit for converting a voltage to a frequency, said voltage controlled oscillator circuit comprising:

an input for receiving a voltage input signal;

an integrator coupled to said input for receiving the voltage input signal and generating a ramp signal;

an adjustable current supply coupled to the integrator for supplying an adjustable amount of current;

a comparator for comparing the ramp signal with a predetermined voltage; and an output for generating a frequency output signal as a function of the comparison, wherein said oscillator circuit is calibratable by adjusting current generated by the adjustable current supply, wherein said integrator comprises an operational amplifier having a negative terminal and a positive terminal, wherein said voltage input signal is applied to the negative terminal and a reference voltage is applied to the positive terminal.

2. The voltage controlled oscillator circuit as defined in claim 1 further comprising a switch coupled between the current supply and the negative terminal of the operational amplifier.

3. The voltage controlled oscillator circuit as defined in claim 1, wherein said reference voltage is adjustable to adjust offset in the ramp signal.

4. An adjustable voltage controlled oscillator circuit for converting a voltage to a frequency, said voltage controlled oscillator circuit comprising:

an input for receiving a voltage input signal;

an integrator coupled to said input for receiving the voltage input signal and generating a ramp signal;

an adjustable current supply coupled to the integrator for supplying an adjustable amount of current;

a comparator for comparing the ramp signal with a predetermined voltage;

an output for generating a frequency output signal as a function of the comparison, wherein said oscillator circuit is calibratable by adjusting current generated by the adjustable current supply; and a oneshot circuit coupled to the output of the comparator.

5. An adjustable voltage controlled oscillator circuit for converting a voltage to a frequency, said voltage controlled oscillator circuit comprising:

an input for receiving a voltage input signal;

an integrator coupled to said input for receiving the voltage input signal and generating a ramp signal;

an adjustable current supply coupled to the integrator for supplying an adjustable amount of current;

a comparator for comparing the ramp signal with a predetermined voltage;

an output for generating a frequency output signal as a function of the comparison, wherein said oscillator circuit is calibratable by adjusting current generated by the adjustable current supply; and a voltage regulator coupled to a voltage supply, wherein said voltage regulator generates a regulated voltage supply for powering the integrator and comparator.

6. The voltage controlled oscillator circuit as defined in claim 5, wherein said adjustable current supply is powered by a voltage source independent of the regulated voltage supply.

7. An adjustable voltage controlled oscillator circuit for converting a voltage to a frequency, said voltage controlled oscillator circuit comprising:

an input for receiving a voltage input signal;

an integrator coupled to said input for receiving the voltage input signal and generating a ramp signal;

an adjustable current supply coupled to the integrator for supplying an adjustable amount of current;

a comparator for comparing the ramp signal with a predetermined voltage; and an output for generating a frequency output signal as a function of the comparison, wherein said oscillator circuit is calibratable by adjusting current generated by the adjustable current supply, wherein said adjustable current supply comprises a first current supply coupled to the input of the integrator and a second current supply coupled to the output of the integrator and supplying current thereto.

8. The voltage controlled oscillator circuit as defined in claim 7, wherein said second current supply coupled to the output of the integrator is substantially equal to the first current supply coupled to the input of the integrator.

9. An adjustable voltage controlled oscillator circuit for converting a voltage to a frequency, said voltage controlled oscillator circuit comprising:

an input for receiving a voltage input signal;

an integrator coupled to said input for receiving the voltage input signal and generating a ramp signal;

an adjustable current supply coupled to the integrator for supplying an adjustable amount of current to an input and output of the intergrator;

a comparator for comparing the ramp signal with a predetermined voltage; and an output for generating a frequency output signal as a function of the comparison, wherein said oscillator circuit is calibratable by adjusting current generated by the adjustable current supply, wherein said circuit has about a fifty percent duty cycle.

10. An adjustable voltage controlled oscillator circuit for converting a voltage to a frequency, said voltage controlled oscillator circuit comprising:

an input for receiving a voltage input signal;

an integrator coupled to said input for receiving the voltage input signal and generating a ramp signal;

an adjustable current supply coupled to the integrator for supplying an adjustable amount of current;

a comparator for comparing the ramp signal with a predetermined voltage; and an output for generating a frequency output signal as a function of the comparison, wherein said oscillator circuit is calibratable by adjusting current generated by the adjustable current supply, wherein said input voltage is generated by a mass air flow meter for metering air flow into an internal combustion engine.

11. A voltage controlled oscillator circuit for converting a voltage to a frequency, said voltage controlled oscillator circuit comprising:

an input for receiving a voltage input signal;

an integrator coupled to said input for receiving the voltage input signal and generating a ramp signal;

a first current supply coupled to an input of the integrator for supplying a first current;

a second current supply coupled to an output of the integrator for supplying a second current;

a comparator for comparing the ramp signal with a predetermined voltage; and an output for generating a frequency output signal as a function of the comparison, wherein said first and second currents are applied together so as to reduce the amount of current required by the integrator, wherein said integrator comprises an operational amplifier having a negative terminal and a positive terminal, and wherein said voltage input signal is applied to the negative terminal, a reference voltage is applied to the positive terminal, and said first current is applied to the negative terminal.

12. The voltage controlled oscillator circuit as defined in claim 11, wherein said first and second currents are substantially equal.

13. The voltage controlled oscillator circuit as defined in claim 11, wherein said first current source comprises an adjustable current source, and said second current source comprises an adjustable current source.

14. The voltage controlled oscillator circuit as defined in claim 11 further comprising a first switch coupled to the first current suplly for controlling the first current applied to the input of the integrator, and a second switch coupled to the output of the integrator for controlling the second current supply, wherein said first and second switches are controlled so as to turn off and on at the same time.

15. The voltage controlled oscillator circuit as defined in claim 11 further comprising a voltage regulator coupled to a voltage supply, wherein the voltage regulator generates a regulated voltage supply for powering the integrator and comparator, and said first and second current supplies are powered by the voltage source independent of the regulated voltage.

16. The voltage controlled oscillator circuit as defined in claim 11 further comprising a oneshot circuit coupled to the output of the comparator.

17. The voltage controlled oscillator circuit as defined in claim 11, wherein said input voltage is generated by a mass air flow meter for metering air flow into an internal combustion engine.

18. An adjustable voltage controlled oscillator circuit for use in a mass air flow meter, said voltage controlled oscillator circuit comprising:

an input for receiving a voltage input signal;

an integrator coupled to the input for receiving the voltage input signal and generating a ramp signal, said integrator including an operational amplifier, a resistance, and a capacitance;

a first adjustable current supply coupled to an input of the integrator for supplying an adjustable first current;

a second adjustable current supply coupled to an output of the integrator for supplying an adjustable second current;

a comparator for comparing the ramp signal with a predetermined voltage; and an output for generating a frequency output signal as a function of the comparison, wherein said adjustable circuit is calibratable by adjusting the first current generated by the first adjustable current supply.

19. The voltage controlled oscillator circuit as defined in claim 18, wherein said first and second adjustable currents are substantially equal.

20. The voltage controlled oscillator circuit as defined in claim 18, wherein said operational amplifier includes a negative terminal coupled to said input, and a positive terminal coupled to an adjustable reference voltage, wherein said adjustable reference voltage is adjustable to adjust offset in the ramp signal.

21. The voltage controlled oscillator circuit as defined in claim 18 further comprising a voltage regulator coupled to a voltage supply, wherein said voltage regulator generates a regulated voltage supply for powering the operational amplifier and comparator, wherein said first and second adjustable current supplies are powered by the voltage supply independent of the regulated voltage.

* * * * *